United States Patent
Srinivas

(10) Patent No.: US 10,089,998 B1
(45) Date of Patent: Oct. 2, 2018

(54) METHOD AND APPARATUS FOR PROCESSING AUDIO SIGNALS IN A MULTI-MICROPHONE SYSTEM

(71) Applicant: Advanced Micro Devices, Inc., Santa Clara, CA (US)

(72) Inventor: A Srinivas, Hyderabad (IN)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 15/871,741

(22) Filed: Jan. 15, 2018

(51) Int. Cl.
  *H04R 3/00* (2006.01)
  *G10L 21/0216* (2013.01)
  *H04R 1/40* (2006.01)
  *H03H 21/00* (2006.01)

(52) U.S. Cl.
  CPC ..... *G10L 21/0216* (2013.01); *H03H 21/0043* (2013.01); *H04R 1/406* (2013.01); *H04R 3/005* (2013.01); *G10L 2021/02166* (2013.01); *H03H 2021/0061* (2013.01); *H04R 2201/403* (2013.01)

(58) Field of Classification Search
  CPC ...... G10L 21/0216; G10L 2021/02166; H03H 21/0043; H03H 2021/0061; H04R 3/005; H04R 3/04; H04R 1/406; H04R 1/342; H04R 2201/401; H04R 2201/403; H04R 2201/405; H04R 25/407
  USPC .......... 381/26, 91, 92, 122, 80, 97, 111–115, 381/356; 367/137, 138
  See application file for complete search history.

(56) References Cited

U.S. PATENT DOCUMENTS 6,317,501 B1 * 11/2001 Matsuo .................. H04R 3/005
                                           381/122
7,171,008 B2 *  1/2007 Elko ...................... H04R 3/005
                                           381/122
7,995,767 B2 *  8/2011 Amada ........................... 381/17

(Continued)

OTHER PUBLICATIONS

Aarabi, P. et al., Phase-Based Dual-Microphone Robust Speech Enhancement, IEEE Transactions on Systems, Man, and Cybernetics—Part B: Cybernetics, vol. 34, No. 4, Aug. 2004 (manuscript received Oct. 2003).

(Continued)

*Primary Examiner* — Xu Mei
(74) *Attorney, Agent, or Firm* — Park, Vaughan, Fleming & Dowler LLP

(57) ABSTRACT

An electronic device includes a plurality of microphones, each pair of microphones in the plurality of microphones being a respective distance from one another. The electronic device also includes a beamformer functional block that receives audio signals from each of the microphones. The beamformer functional block detects a dominant microphone from among the plurality of microphones based on the audio signals from each of the microphones and the distances between the microphones, the dominant microphone being in a closest direction to a source of desired audio. The beamformer functional block also detects interfering audio signals based on phase coherence between audio signals from the dominant microphone and audio signals from other microphones in the plurality of microphones. The beamformer functional block generates a beamformed audio output signal based on the audio signals and the interfering audio signals from each of the microphones.

20 Claims, 4 Drawing Sheets

(56) References Cited

U.S. PATENT DOCUMENTS

| | | | | |
|---|---|---|---|---|
| 8,577,054 B2* | 11/2013 | Hiroe | ................ | G10L 21/0272 |
| | | | | 367/119 |
| 8,842,851 B2* | 9/2014 | Beaucoup | .............. | H04R 3/005 |
| | | | | 381/122 |
| 9,502,021 B1* | 11/2016 | Kleijn | ................ | G10L 21/0316 |
| 9,508,357 B1* | 11/2016 | Krishnaswamy | ....... | G10L 21/02 |
| 2014/0358532 A1* | 12/2014 | Lin | ........................ | H04S 7/305 |
| | | | | 704/226 |
| 2014/0372129 A1* | 12/2014 | Tzirkel-Hancock | ... | H04R 3/005 |
| | | | | 704/278 |

OTHER PUBLICATIONS

Hoshuyama, O. et al., A Robust Adaptive Beamformer with a Blocking Matrix using Coefficient-Constrained Adaptive Filters, IEICE Trans. Fundamentals, vol. E82-A, No. 4, Apr. 1999 (manuscript received Apr. 1998).

* cited by examiner

METHOD AND APPARATUS FOR PROCESSING AUDIO SIGNALS IN A MULTI-MICROPHONE SYSTEM

BACKGROUND

Related Art

Some electronic devices use arrays of two or more microphones to capture audio signals such as human speech. For example, such electronic devices may capture and process speech for enabling voice commands, may store and play back captured audio, etc. These electronic devices often operate in environments in which interfering audio signals can be captured along with desired audio signals, such as in an environment where other speakers are speaking. Because audio signals that are captured along with interfering audio signals can be difficult or impossible to use for subsequent operations (e.g., the above-described speech recognition, captured audio playback, etc.), designers have proposed electronic devices that include mechanisms for avoiding the effects of interfering audio signals. For example, designers have proposed using beamformers in electronic devices to process received audio signals, the beamformers generating an output audio signal in which desired audio is included, but with reduced effect from interfering audio signals. For processing received audio signals, beamformers scan peaks of cross power spectral density (CPSD) for audio signals received in various azimuth and elevation angles to determine a direction from which desired audio signals are approaching the array of microphones. The beamformers then use the direction from which desired audio signals are approaching to configure internal filters (e.g., to set weights for the internal filters) that filter the audio signals received by the microphones to produce an output audio signal. Although beamformers are useful for processing audio signals, the scanning for CPSD technique used for determining the direction of approaching audio is computationally intensive—and becomes more computationally intensive as finer azimuth and/or elevation angles must be used (e.g., for closely-spaced arrays of microphones). Designers might try using coarser azimuth and/or elevation angles to enable the beamformer to avoid some of the computational work, but using coarser azimuth and/or elevation angles can result in a beamformer incorrectly detecting the direction of desired audio signals and configuring the filters based on the incorrect detection. In this case, the resulting output audio signal can be highly distorted and thus difficult or impossible to use in subsequent operations.

BRIEF DESCRIPTION OF THE FIGURES

Throughout the figures and the description, like reference numerals refer to the same figure elements.

DETAILED DESCRIPTION

Figure 1:
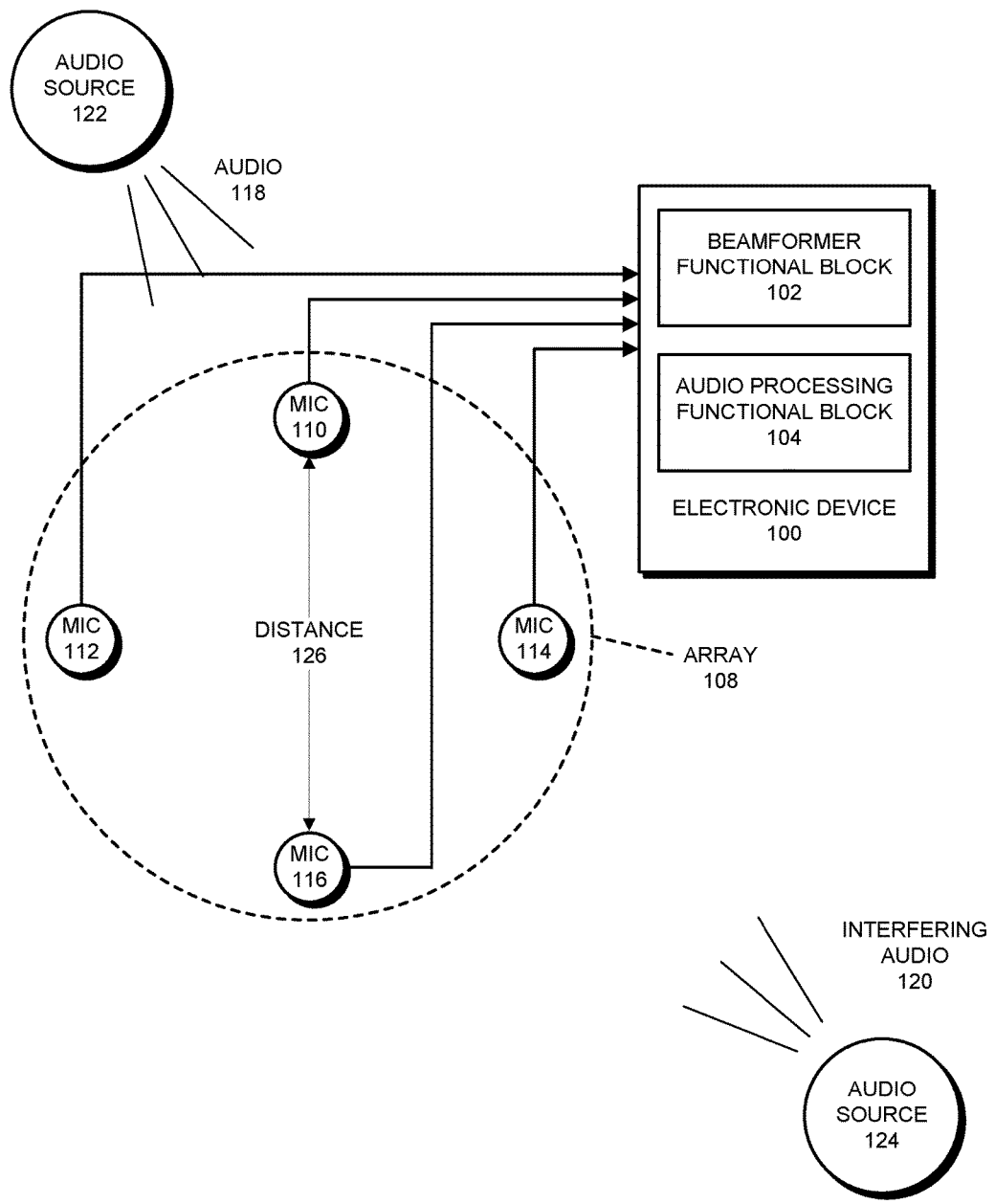
FIG. 1 presents a block diagram illustrating an electronic device in accordance with some embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that the term may have significant additional aspects that are not recited herein for clarity and brevity and thus the description is not intended to limit the term.

Functional block: "functional block" as used herein refers to a group, collection, and/or set of one or more interrelated circuit elements such as integrated circuits, discrete circuit elements, etc. The circuit elements are "interrelated" in that circuit elements share at least one property. For instance, the interrelated circuit elements may be included in, fabricated on, or otherwise coupled to a particular integrated circuit chip or portion thereof, may be involved in the performance of given functions (computational functions, memory functions, etc.), may be controlled by a common control element, etc. For example, a functional block may include a set of circuit elements that perform media processing operations, such as a media processor in an electronic device. As another example, a functional block may include a processing pipeline, a compute unit, or dedicated processing circuits in a central processing unit (CPU) or graphics processing unit (GPU) in an electronic device. Note that, for the latter example, at least some circuit elements in the CPU or GPU—i.e., circuit elements outside the processing pipeline, etc.—are not included in the indicated functional block. A functional block can include any number of circuit elements, from a single circuit element (e.g., a single integrated circuit logic gate) to millions or billions of circuit elements (e.g., an integrated circuit memory), etc.

Overview

The described embodiments include an electronic device that performs operations for processing audio signals, such as speech, music, environmental sounds, etc., in order to generate an output signal that reproduces desired audio signals with reduced effects due to interfering audio signals. In the described embodiments, the electronic device is coupled to microphones in an array of two or more microphones. During operation, a beamformer functional block in the electronic device receives audio signals from each of the microphones. Based on the received audio signals, the beamformer functional block detects a dominant microphone, the dominant microphone being a microphone that is estimated to be in a direction of arrival of desired audio signals. The beamformer functional block, using audio signals from the dominant microphone, detects interfering audio signals, which are undesirable audio signals that are received in directions of arrival other than the direction of arrival of the desired audio signals. The beamformer functional block then generates a combined audio signal by summing the audio signal from the dominant microphone with a synchronized (in time) audio signal from each other microphone and then filters the interfering audio signals from the combined audio signal to generate a beamformed audio output signal.

In some embodiments, the detection of the dominant microphone is performed by determining an entropy (or a degree of noisiness or power), of each microphone in the array and selecting, as the dominant microphone, the microphone with the highest entropy. In these embodiments, in order to detect the entropy, the beamformer functional block generates a synchronized audio signal for each microphone and detects the entropy of the synchronized audio signal. The synchronized audio signal is a summation of the audio signal from a given microphone and audio signals from other microphones that have been aligned in time with the given microphone. In these embodiments, the "alignment" in time involves ensuring that an audio signal used in the summation for each microphone is substantially the same signal as that signal reaches each microphone—and is based on the distance between the microphones and the flight time of audio signals.

In some embodiments, the detection of the interfering audio signals is performed using phase coherence between audio signals from the dominant microphone and one or more other reference microphones. More specifically, the interference detection is performed by selecting one or more other microphones (other than the dominant microphone) and converting selected samples of audio signals from the dominant microphone and the other microphones into the frequency domain (e.g., via fast Fourier transform, etc.). A sum of an estimated phase coherence of the frequency domain representations is then computed and used to detect interfering audio signals.

In some embodiments, the filtering includes using an arrangement of frequency normalized least mean square (FNLMS) filters. In these embodiments, two respective different sets of estimated filter coefficients may be used for each of the FNLMS filters. For example, a first set of coefficients may be used when desired audio signals are detected and a second set of coefficients may be used when interfering audio signals are detected.

By performing the operations herein described, the described embodiments provide a beamformer that requires less computational effort than existing beamformers to generate beamformed audio outputs with reduced interference. This means that the electronic device can more efficiently perform various operations that rely on beamformed audio signals.

Electronic Device

FIG. 1 presents a block diagram illustrating an electronic device 100 in accordance with some embodiments. As described herein, electronic device 100 performs operations relating to the processing of audio such as speech, music, environmental sounds, industrial sounds, and/or other sounds. More specifically, in the described embodiments, electronic device 100 receives desired audio and interfering audio from audio sources via an array of microphones and performs processing operations for generating a beamformed audio output signal in which the desired audio is reproduced with reduced effects of the interfering audio.

As can be seen in FIG. 1, electronic device 100 includes beamformer functional block 102 and audio processing functional block 104. Beamformer functional block 102 is a functional block that is configured to perform processing operations for generating the above-described beamformed audio output signal. Beamformer functional block 102 is described in more detail below with respect to FIG. 2.

Audio processing functional block 104 is a functional block that performs operations for handling the beamformed audio output signal produced by beamformer functional block 102. The particular internal elements of audio processing functional block 104 depend on the nature of electronic device 100. For example, audio processing functional block 104 may include processors such as a microprocessor or microprocessor core, an application-specific integrated circuit (ASIC), a field programmable gate array, and/or another type of processor. In some embodiments, audio processing functional block 104 includes circuit elements such as memory circuits and corresponding control circuits that are configured to store and subsequently provide the beamformed audio output signal (e.g., to external devices, etc.). In some embodiments, audio processing functional block 104 includes audio-recognition processing circuitry such as speech recognition, intrusion detection, and/or voice command processing circuitry. In some embodiments audio processing functional block 104 includes output circuit elements such as a network interface (e.g., for outputting an audio stream based on the beamformed audio output signal), an audio playback mechanism, amplifier, and one or more speakers, etc.

Electronic device 100 is coupled, via one or more wired or wireless connections, to an array 108 of microphones that includes microphones ("MIC") 110-116. Microphones 110-116 are omni-directional digital microphones that receive ambient audio such as speech, environmental sounds, etc. and produce digital output audio signals based on the received ambient audio. For example, microphones 110-116 can be or include one or more of dynamic microphones, condenser microphones, and piezoelectric microphones. The audio output signals are received by electronic device 100 and processed in beamformer functional block 102 to perform the operations herein described.

As can be seen in FIG. 1, audio source 122, which can be a source of speech (a human speaker), an environmental sound source (e.g., an object striking or impacting another object, a musical instrument playing musical notes, etc.), and/or another source of audio, produces audio 118, which is called desired audio herein. As used herein, "desired audio" indicates an audio signal that electronic device 100 preferentially captures, which stands in contrast to interfering audio 120 from audio source 124, which is less desirable or undesired audio that interferes with or otherwise distorts, corrupts, or overrides audio 118. For example, audio source 122 may be a human speaker such as a user of a laptop who is speaking voice commands to a laptop in a coffee shop, and audio source 124 may be or include other customers and employees in the coffee shop, equipment in the coffee shop, and/or street noise. As another example, audio source 122 may be a human making a speaking presentation in a conference room and audio source 124 may be a human speaker in an audience in the conference room or other source of noise.

Distance 126 is the physical distance between a pair of microphones 110 and 116, such as a distance of 15 cm, 1 m, etc. The described embodiments use a known and/or estimated distance 126 between microphones (including, but not limited to, microphones 110 and 116) to determine timing of the arrival of audio signals at the two microphones. In some embodiments, a maximum distance between all pairs of microphones is used to determine a size of an audio sampling buffer (i.e., memory circuits in which audio samples are stored after capture) to enable the operations herein described. In such embodiments, for a larger maximum distance, a larger buffer may be used, as larger numbers of audio signal samples are to be stored to enable comparison of signals and other operations herein described.

Although certain functional blocks, components, and elements are shown in electronic device 100, beamformer functional block 102, and audio processing functional block 104, in some embodiments, different functional blocks, components, and/or elements are included in electronic device 100. For example, electronic device 100 may include one or more additional functional blocks. As another example, in some embodiments, array 108 includes a different number of microphones, such as two microphones, six microphones, etc. In addition, although electronic device 100 is simplified for illustrative purposes, in some embodiments, electronic device 100 includes additional or different subsystems, functional blocks, circuit elements, and/or communication paths. For example, electronic device 100 may include power subsystems, display subsystems, networking subsystems, etc. Generally, electronic device 100 includes sufficient subsystems, functional blocks, circuit elements, and/or communication paths to perform the operations herein described.

Electronic device 100 can be, or can be included in, any device that performs operations based on audio signals. For example, electronic device 100 can be, or can be included in, a desktop computer, a laptop computer, a wearable computing device, a tablet computer, a piece of virtual or augmented reality equipment, a smart phone, an artificial intelligence (AI) device, a server, a network appliance, a toy, a piece of audio-visual equipment, a home appliance, a vehicle, etc., and/or combinations thereof.

Beamformer Functional Block

Figure 2:
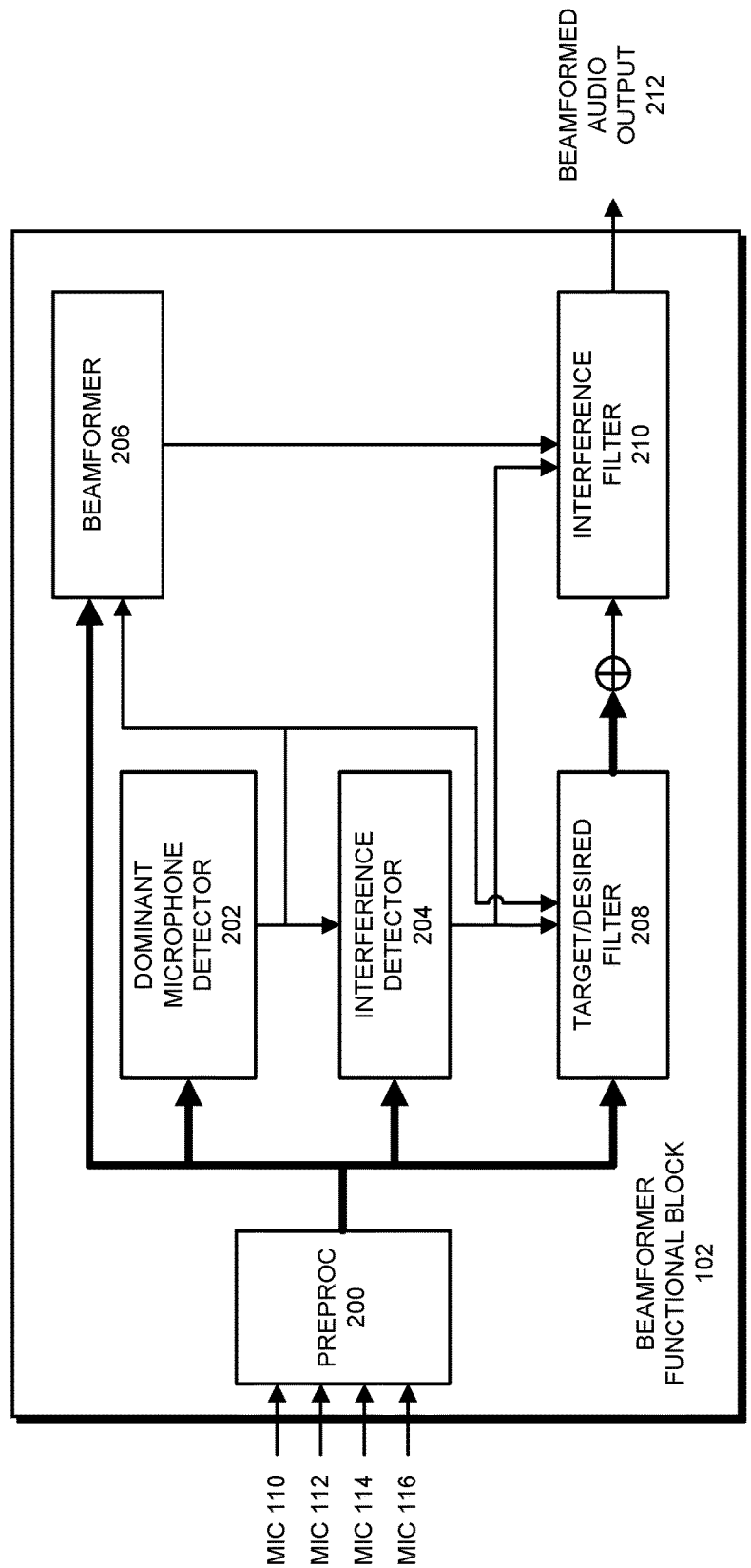
FIG. 2 presents a block diagram illustrating a beamformer functional block in accordance with some embodiments.

As described above, electronic device 100 includes beamformer functional block 102, which is a functional block that performs operations for generating a beamformed audio output signal based on audio signals received from microphones in array 108 of microphones 110-116. FIG. 2 presents a block diagram illustrating beamformer functional block 102 in accordance with some embodiments. As can be seen in FIG. 2, beamformer functional block 102 includes preprocessor ("PREPROC") 200, dominant microphone detector 202, interference detector 204, beamformer 206, target/desired filter 208, and interference filter 210.

Preprocessor 200 is a functional block that performs operations for preprocessing audio signals received from microphones 110-116 in order to prepare the audio signals for subsequent processing in beamformer functional block 102. For example, in some embodiments, preprocessor 200 filters the audio signals to remove undesirable portions (e.g., direct current/DC portions and/or low frequencies such as below N Hz, etc.). As another example, in some embodiments, preprocessor 200 adjusts the levels of received audio signals to pre-set level(s), thereby enabling simpler processing in subsequent functional blocks (in contrast to embodiments in which signals produced by microphones at different levels are to be processed in beamformer functional block 102).

Dominant microphone detector 202 is a functional block that performs operations for estimating a "dominant" microphone in array 108 that is in a closest direction, among microphones 110-116, to a source of desired audio. In other words, dominant microphone detector 202 can detect that microphone 110 is the dominant microphone in the scenario shown in FIG. 1. To make the detection, dominant microphone detector 202 uses entropy (or power or noisiness) in the received audio signals and the flight time of audio signals between microphones as described in more detail below. Dominant microphone detector 202 outputs an identification of the dominant microphone to other functional blocks in beamformer functional block 102 to be used therein for performing corresponding operations.

Interference detector 204 is a functional block that performs operations for detecting whether (or not) interfering audio signals are being received by microphones 110-116. Interference detector 204 detects this by determining phase coherence between the audio signals from two or more microphones and finding interference (or not) when the phase coherence meets corresponding criteria, as described in more detail below. Interference detector 204 outputs a signal that indicates when interfering audio is detected. In some embodiments, interference detector 204 uses one or more mechanisms, such as a hysteresis counter, to ensure that detected interfering audio signals are likely to be interfering audio signals and/or that the signal indicating that the interfering audio signals are occurring should be output.

Beamformer 206 is a functional block that performs operations for generating a combined audio signal by summing the audio signal from the dominant microphone with a synchronized audio signal from each other microphone. The synchronized audio signal from each other microphone is the audio signal for that other microphone aligned in time with the audio signal from the dominant microphone. For example, if an audio signal arrives at time 0 at the dominant microphone (e.g., microphone 110) and a second microphone (e.g., microphone 116) is known to be a given distance away from the dominant microphone (e.g., distance 126), a flight time of audio signals can be used to determine that the audio signals will arrive at the second microphone at time 0+N. The combined audio signal is then generated by summing the audio signals received from the dominant microphone at time 0 to the audio signals received from the second microphone at time 0+N—i.e., audio signals aligned in time. The combined audio signal is output from beamformer 206 to interference filter 210 to be used to generate beamformed audio output 212 as described herein.

Target/desired filter 208 is a functional block that performs operations for generating interference-only audio signals from audio signals received from microphones in array 108. To generate the interference-only audio signals, target/desired filter 208 filters (or "blocks") desired audio signals from the audio signals from each of the microphones using frequency normalized least mean squares (FNLMS) filters. In some embodiments, the filtering is performed using FNLMS filters with two sets of coefficients that are selectively used based on a state of the output signal received from interference detector 204—i.e., based on whether interfering audio has been detected. The individual interference-only audio signals output by target/desired filter 208 are summed, in the summation element that is shown between target/desired filter 208 and interference filter 210, to form a single interfering audio signal which is input to interference filter 210.

Interference filter 210 is a functional block that performs operations for generating beamformed audio output 212 based on the combined audio signal output from beamformer 206 and the interfering audio signal output from target/desired filter 208. To generate the beamformed audio output 212, interference filter 210 filters (or "blocks") the interfering audio signal from the combined audio signal using a frequency normalized least mean square (FNLMS) filter. In some embodiments, the FNLMS filter has two sets of coefficients that are selectively used based on a state of the output signal received from interference detector 204. The beamformed audio output 212 that is output from interference filter 210 is a signal that has had the interfering audio signals, if any, at least partially eliminated, and has had the contribution of each microphone of desired audio (i.e., the desired audio as received and output by each microphone at a corresponding time) summed to form an "enhanced" version of the desired audio. Enhanced, as used herein, means that the desired audio signal is a combination of corresponding signals received from each of the microphones, and thus is not simply the desired audio as received by a single microphone (e.g., the dominant microphone).

Communication routes (wires, guides, etc.) in the form of individual communication routes, buses, etc. are illustrated using arrow-headed lines in FIG. 2 shown between various functional blocks in FIG. 2. As can be seen in FIG. 2, the communication routes output from preprocessor 200 and target/desired filter 208 are shown using thicker lines than the other communication routes in beamformer functional block 102. The thicker lines represent communication routes that carry multiple signals, such as a parallel bus or other collection of signal routes. For example, in some embodiments, four parallel communication routes carry the preprocessed audio signals output from preprocessor 200 to other functional blocks in beamformer functional block 102 (i.e., beamformer 206, dominant microphone detector 202, etc.), one for each audio signal received from microphones 110-116. As another example, in some embodiments, three parallel communication routes carry signals from target/desired filter 208 to the summation element, one for the interference-only audio signal from each microphone other than the dominant microphone.

Although various functional blocks, elements, and communication routes are shown in FIG. 2, in some embodiments other functional blocks, elements, and communication routes are used. Generally, the described embodiments include sufficient functional blocks, elements, and communication paths to enable the operations herein described.

Process for Generating a Beamformed Audio Output

Figure 3:
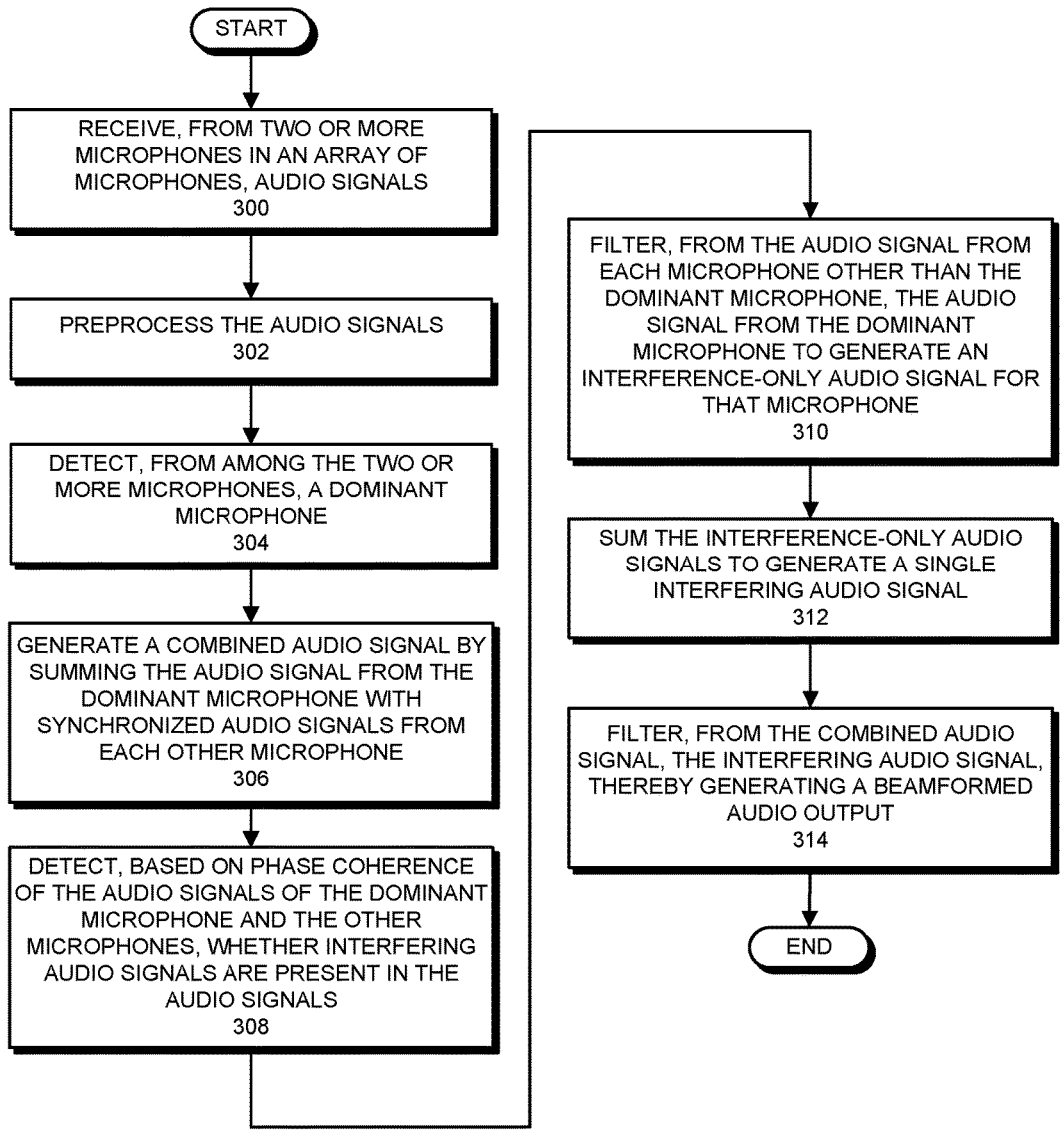
FIG. 3 presents a flowchart illustrating a process for generating a beamformed audio output in accordance with some embodiments.

The described embodiments perform various operations for generating a beamformed audio output. FIG. 3 presents a flowchart illustrating a process for generating a beamformed audio output in accordance with some embodiments. Note that the operations shown in FIG. 3 are presented as a general example of operations performed by some embodiments. The operations performed by other embodiments include different operations and/or operations that are performed in a different order. For the example in FIG. 3, an electronic device having a similar internal arrangement to electronic device 100 is described as performing various operations. In some embodiments, however, a differently-arranged electronic device performs the described operations.

In describing the process shown in FIG. 3, the audio signals, or samples or other portions thereof, are interchangeably referred to as "data," so that data can be received from a given microphone and/or processed data can be received from a given functional block. The term "channel" is interchangeably used to refer to a given microphone and/or the source of an audio signal. In other words, the audio signal/data from a given microphone is received on a corresponding channel. The term "frame" is also used in describing operations performed on, to, and with the audio signal received from a given microphone or the audio signals after processing operations. "Frames" of "data" are portions or subsections of the audio signal for a specified time, such as 10 ms, 60 ms, etc., so that a frame of data includes a number of samples of the audio signal proportional to rate at which the audio signal is sampled, e.g., 16 kHz, 44.1 kHz, 48 kHz, or another sampling rate. The term "regions" is used to describe portions or sub-sections (e.g., one or more frames, etc.) of audio signals in which the audio signals have given properties, such as including interfering audio, desired audio, or some combination thereof.

In describing the various embodiments herein, the four microphones 110-116 in array 108 are interchangeably and generally referred to as "N" microphones. In addition, subsets of the microphones in array 108 are referred to in terms of N, such as N−1 microphones, etc. As described above, the described embodiments are operable with any number of microphones N.

The process shown in FIG. 3 starts when electronic device 100 receives, from microphones 110-116 in array 108, audio signals (step 300). For example, microphones 110-116 may provide digital microphone output signals as the audio signals received by electronic device 100. Referring to FIG. 1, the audio signals received from microphones 110-116 have, at various times, contributions from audio source 122/audio 118 and audio source 124/interfering audio 120, such as when audio source 122 is a human that is speaking and interfering audio 120 is an interfering noise source such as another human speaker, etc. In other words, electronic device 100 can receive audio signals during time periods when audio source 122 or audio source 124 alone is producing audio signals—or when both audio source 122 and 124 are simultaneously producing audio signals, so that audio source 122 produces interfering audio 120 that interferes with audio 118 from audio source 122.

The received audio signals $ip_i$ are forwarded to preprocessor 200 where the audio signals are preprocessed (step 302). In some embodiments, during the preprocessing, the audio signals are filtered to remove direct current (DC) and/or low frequency components, such as frequencies below 70 Hz, 125 Hz, or another frequency. In other words, using the $k^{th}$ frame data from a $i^{th}$ microphone in the array of microphones $ip_i^k$ and assuming that preprocessor 200 includes a high pass filter h with a cutoff frequency X, $ip_i^k = h*ip_i^k$. In some embodiments, during the preprocessing, levels of the audio signals are adjusted to a predetermined level using an automatic level controller (ALC), such as being raised to a given level, being lowered to the given level, etc., which can help to account for variations in audio signals received from different types of microphones.

When the preprocessing is completed, the preprocessed audio signals are forwarded to various other functional blocks in beamformer functional block 102 for processing therein. One of the functional blocks to which the preprocessed audio signals are forwarded is dominant microphone detector 202. Dominant microphone detector 202, detects a dominant microphone (or channel) (step 304). The dominant microphone (or channel) is the microphone from among microphones 110-116 in array 108 that is in a closest direction to a source of desired audio—and may also be the microphone that is closest physically to the source of desired audio. In other words, dominant microphone detector 202 identifies, based on corresponding audio signals and distances between the microphones, a particular microphone that is estimated to be closest to a source of desired audio, such as audio source 122. In order to detect the dominant microphone, dominant microphone detector 202 generates a sum of synchronized preprocessed audio signals from each microphone, estimates a maximum entropy for that microphone, and then detects the microphone from among microphones 110-116 with maximum entropy as the dominant microphone.

In some embodiments, for detecting the dominant microphone, $d_{mic}$ represents the linear distance between pairs of microphones in the microphone array. The spatial delay experienced between the capture of the same audio signal as the audio signal reaches/propagates to each microphone in the particular pair of microphones is proportional to $d_{mic}$. For example, a sampling rate at which the audio signals are captured or a "capture sampling rate" Fs and speed of sound $v_s$ are used to compute this spatial delay, in the digital domain as particular audio signal samples (i.e., audio samples at a given time), as follows:

$$dly_{smpls} = \frac{Fs * d_{mic}}{v_s}$$

Frame-wise entropy, $entpy_i^k$, is estimated for every channel (or microphone) in the array, by choosing one of the channels as reference channel (an $i^{th}$ channel) and adjusting the remaining N−1 channel's input data with the pre-calculated $dly_{smpls}$ for the corresponding channel to synchronize the data from the channels as follows:

$$entpy_i^k = \text{sum}((ip_i^k + ipd_j^k))^2\{(\forall j \neq i) \& (\forall i)\}$$

where $ipd_j^k$ is a buffer of the $j^{th}$ channel consisting of $k^{th}$ frame data and $dly_{smpls}$ of the past $(k-1)^{th}$ frame:

$$ipd_j^k = [ip_j^{k-1}(dly_{smpls}); ip_j^k]$$

The entropies for each channel/microphone are sorted in decreasing order and a microphone m with maximum entropy, which is greater than microphone m1 with the next maximum entropy is the dominant microphone. In some embodiments, the microphone with the maximum entropy by a threshold, $doa_{dsth}$, for K consecutive frames over a microphone with the next maximum entropy is the dominant microphone, for example:

$$entpy_m^k > entpy_{m1}^k + doa_{dsth}$$

In some embodiments, the estimated entropy $entpy_i^k$ is filtered using a moving average filter to remove intermittent spurious peaks if any and provide a smooth envelope for each channel:

$$entpy_i^k = \alpha * entpy_i^{k-1} + (1-\alpha) * entpy_i^k \{(\forall i=(1:N)), \alpha=0.64\}.$$

After the preprocessing, the preprocessed audio signals are also forwarded to beamformer 206. Beamformer 206 generates a combined audio signal by summing the audio signal from the dominant microphone/channel (or another reference microphone) with a synchronized audio signal from each other microphone/channel (step 306). In the described embodiments, the synchronized audio signal from each other microphone is the audio signal for that other microphone aligned in time with the audio signal from the reference microphone. The synchronization is based on the delay that occurs between two microphones. In other words, synchronization is achieved by estimating the time delay between the reference microphone data and the other N−1 channels data in the microphone array and adjusting the estimated delay in each of the N−1 channels of microphone data respectively before summing. The combined audio signal is therefore a single signal that is composed of a summation of the individual delay-compensated audio signals from each microphone (i.e., the audio signals after preprocessing).

In some embodiments, the delay between channels is estimated by estimating the peak location of cross correlation between input data or using adaptive least mean squares (LMS) filter to estimate underlying impulse response between input data, the peak index of estimated impulse response of LMS filter indicating the delay. In embodiments that use estimates of the peak location of cross correlation for estimating delay, $ip_{ref}^k$ is the $k^{th}$ frame of reference microphone data and $ip_j^k$ is the $k^{th}$ frame of another microphone, i.e., a $j^{th}$ microphone/channel. In these embodiments, cross correlation of $k^{th}$ frame of $ip_{ref}^k$ and $ip_j^k$ is denoted as $corr_j^k$ and is defined as:

$$corr_j^k(n) = \sum_{p=0}^{2*sz-1} ip_{ref}^k(p+n) * ip_j^k(n)\{(n \geq 0), (\forall j \neq i)\}$$

An index location of maximum of absolute of $corr_j^k$ is calculated, which corresponds to a delay $d_j^k$ in frames/samples between reference channel data and $j^{th}$ channel input data. The estimated delay $d_j^k$ between microphone data can be either positive, negative, or zero.

When the delay estimated $d_j^k$ between the microphone data is positive, the $j^{th}$ channel is delayed to the reference channel by $d_j^k$ samples, in this case, the $k^{th}$ frame data of the reference channel and $d_j^k$ samples of past k−1 frame of the reference channel are added to the $j^{th}$ channel data. This delays the reference channel data to time-align the reference channel data with the $j^{th}$ channel data. In this case, the combined audio signal $fbmop^k$ with regard to $j^{th}$ channel data is:

$$fbmop^k = (ip_j^k + ipd_{ref}^k)\{(\forall j \neq \text{ref}) \& (\forall j)\}$$

where:

$$ipd_{ref}^k = [ip_{ref}^{k-1}(d_j^k); ip_{ref}^k]\{(\forall j \neq \text{ref}) \& (\forall j)\}$$

When the delay estimated $d_j^k$ between microphone data is negative, the reference channel is delayed to the $j^{th}$ channel data by $d_j^k$ samples, in this case $k^{th}$ frame data of $j^{th}$ channel data and $d_j^k$ samples of past k−1 frame of the $j^{th}$ channel are added to the reference channel data. This process delays the $j^{th}$ channel data to time-align the $j^{th}$ channel data with reference channel data. In this case, the combined audio signal $fbmop^k$ with regard to $j^{th}$ channel data is:

$$fbmop^k = (ip_{ref}^k + ipd_j^k)\{(\forall j \neq \text{ref}) \& (\forall j)\}$$

where:

$$ipd_j^k = [ip_j^{k-1}(d_j^k); ip_j^k]\{(\forall j \neq \text{ref}) \& (\forall j)\}$$

When the delay estimated $d_i^k$ between microphone data is zero, the reference channel data is in synchronization with the $j^{th}$ channel data and the combined audio signal $fbmop^k$ with regard to $j^{th}$ channel data is:

$$fbmop^k = (ip_{ref}^k + ip_j^k)\{(\forall j \neq \text{ref}) \& (\forall j)\}$$

The technique described above for generating the combined audio signal $fbmop^k$, i.e., the synchronization of each microphone channel with the reference channel and summation, can result in phase synchronization of the audio signals leading to constructive addition of the desired audio—and possibly, therefore, enhancement of the desired audio. In addition, due to effects such as the random phase of noise components, destructive addition can occur in interfering audio regions during the summation, resulting in improved signal to noise ratio (SNR) in the combined audio signal.

After the preprocessing, the preprocessed audio signals are also forwarded to interference detector 204. Interference detector 204 produces, based on the preprocessed audio signal, an output signal that indicates whether (or not) interfering audio signals have been detected. Generally, interfering audio signals are audio signals that approach array 108 from a direction other than the direction of desired audio signals. For example, interfering audio 120 from audio source 124 approaches array 108 from approximately the other side of array 108 from audio 118, which is the desired audio for the examples herein. Interference detector 204 detects whether interfering audio signals are present in the audio signals based at least in part on mutual phase information/phase coherence for audio signals from the dominant microphone and one or more other microphones from array 108 (step 308). Because interfering audio signals are typically in other temporal space, i.e., have different delay in the time domain, the interfering audio signals will often be out of phase for interference regions in phase coherence.

In some embodiments, in order to detect the interfering audio signals, interference detector 204 receives the identification of the dominant microphone from dominant microphone detector 202. Interference detector 204 then selects one or more other microphones to be checked against the dominant microphone for interfering audio components in microphone data. In some embodiments, the selection of the one or more other microphones is based at least in part on the number of microphones/channels in array 108. For example, in some embodiments in which array 108 has only two microphones, the single other microphone/channel is selected the microphone to be checked. As another example, in some embodiments with three or more microphones in array 108, the selected number of microphones is based on array geometry, with a minimum of two other channels selected.

Next, assuming that $ip_{ref}^k$ is the $k^{th}$ frame of reference microphone data and $ip_j^k$ is the $k^{th}$ frame of data from the other microphones being checked, with 6 ms of past/prior channel data used in addition to 10 ms of present channel data, the accumulated past/present data of all channels is separately windowed using a Hann function $h_{hann}$ of 16 ms length to suppress side lobes:

$ipi_{ref}^k = [ip_{ref}^{k-1}(6\ ms); ip_{ref}^k] * h_{hann}$ $ipi_j^k = [ip_j^{k-1}(6\ ms); ip_j^k] * h_{hann} \{(\forall j \ne ref) \& (\forall j \le N)\}$ The accumulated data of all channels, once processed using the Hann function, is converted into a frequency domain representation using a fast Fourier transform (FFT) or another algorithm:

$IPI_{ref}^k = FFT(ipi_{ref}^k);$ $IPI_j^k = FFT(ipi_j^k);$

An estimated phase coherence $Phs_j^k$ is calculated by computing the coherence of the frequency domain representations and extracting imaginary components of the representations, which represent phase. In some embodiments, estimated phase coherence $Phs_j^k$ is filtered with moving average filter to remove intermittent spurious values, if any:

$Phs_j^k = Phs_j^{k-1} * \alpha + (1-\alpha) * (imag(IPI_{ref}^k * conj(IPI_j^k)));$
$\{\alpha = 0.68\};$ Estimated phase coherence is then summed $Sm_{phs}(j)$ in a specified frequency range that is selected based on the frequency content of the audio signals, i.e., that includes phase information useful for interference computations given the particular audio signals. For example, for human speech, the specified frequency range can be a speech information presence frequency range such as 300-2000 Hz, resulting in the following summation:

$$Sm_{phs}(j) = \sum_{f=300}^{2000} Phs_j^k(f) \quad \{j\ depends\ on\ N\}$$

In these embodiments, when the estimated phase coherence sum, $Sm_{phs}(j)$, for all microphone configurations $\{(\forall j \ne ref) \& (\forall j < N)\}$ is positive or zero, interference detector 204 outputs a signal $ID_{dsn}$ indicating the presence of target or desired data regions in the input audio signals ($ID_{dsn}=0$). Otherwise, when $Sm_{phs}(j)$ is negative and less than a minimum threshold $it_{th}$, interference detector 204 outputs a signal $ID_{dsn}$ indicating the presence of interference in the input audio signals ($ID_{dsn}=1$):

$$ID_{dsn} = \begin{cases} 0; & \{Sm_{phs}(j) \ge 0\} \\ 1; & \{Sm_{phs}(j) < it_{th}; it_{th} = -0.0005\} \end{cases}$$

In some embodiments, interference detector 204 uses a hysteresis counter $HYSID_{cnt}$ to determine how the output signal $ID_{dsn}$ is to be set in order to avoid instability or rapid changes in $ID_{dsn}$. In these embodiments, the hysteresis counter $HYSID_{cnt}$ is decremented when non-interference regions are detected (i.e., when desired audio signals are detected) and re-initialized, or reset to a specified value, when interference is detected, thereby requiring that a corresponding number of detections of non-interfering audio signals be made before changing $ID_{dsn}$:

$HYSID_{cnt} = 10; \{if\ ID_{dsn} == 1\}$ $HYSID_{cnt} = (HYSID_{cnt} - 1); \{if\ ID_{dsn} == 0\}$ After the preprocessing, the preprocessed audio signals are also forwarded to target/desired filter 208. Target/desired filter 208 filters, from the audio signal from each other microphone, the audio signal from the dominant microphone to generate an interference-only audio signal for that microphone (step 310). In other words, a "target" or "desired" audio signal from the dominant microphone is subtracted, blocked, or otherwise removed from the audio signal from each other microphone, leaving the interference-only audio signal. The interference-only audio signal of each of the other microphones is then summed to form an interfering audio signal (step 312). During this operation, the individual interference-only audio signals for the other microphones (three in the examples shown in FIGS. 1-2) are summed to form a single interfering audio signal that is a combination of all the individual interfering audio signals, e.g., in the summation element that is shown in FIG. 2.

Figure 4:
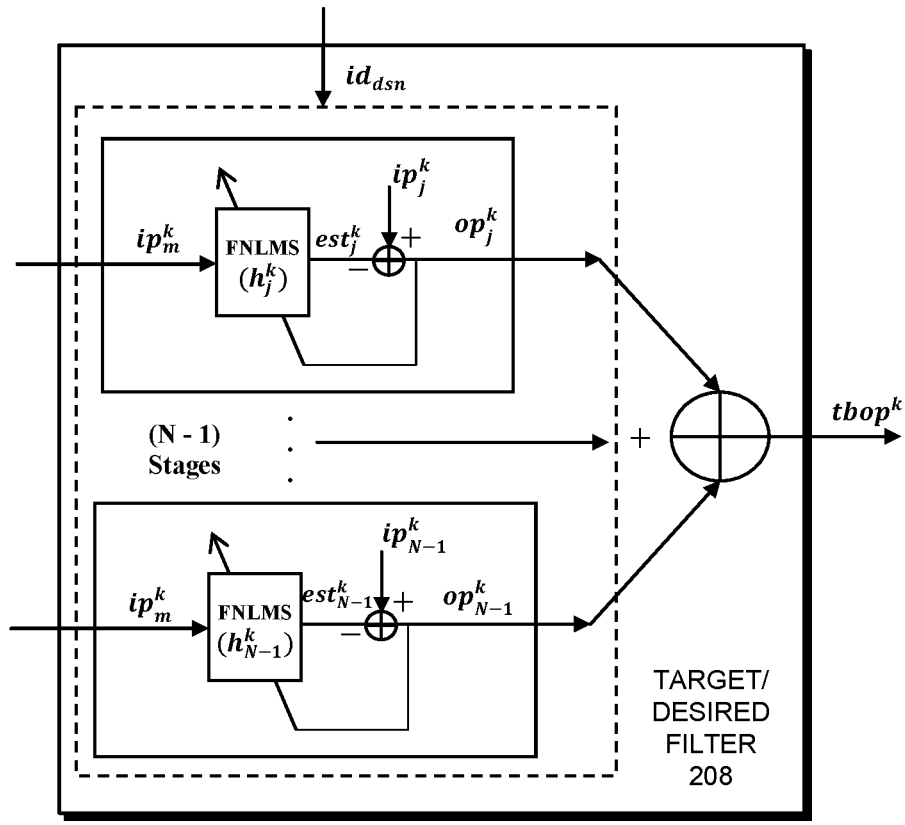
FIG. 4 presents a block diagram illustrating filters in a target/desired filter functional block in accordance with some embodiments.

In some embodiments, target/desired filter 208 uses an adaptive filter based technique for filtering out the desired audio signals that employs frequency normalized least mean square (FNLMS) filters. In these embodiments, using FNLMS filters has the benefits of reducing or removing correlation in input data, operating despite variations in input data, addressing non-linear relations between input data/audio signals, and reducing clock and memory requirements. FIG. 4 presents a block diagram illustrating FNLMS filters in target/desired filter 208 in accordance with some embodiments. Although particular elements are shown in target/desired filter 208 in FIG. 4, in some embodiments, different elements are used. Generally, target/desired filter 208, given the indication $ID_{dsn}$ of interfering audio from interference detector 204, the audio signal of the dominant microphone $ip_j^k$, and the audio signal of each other microphone, generates the interference-only audio signal for each microphone.

As can be seen in FIG. 4, for the N channel microphone array, N−1 target blocking FNLMS filters are used in target/desired filter 208. In some embodiments, the FNLMS filters are configured to use different filter coefficients for different adaptation regions—i.e., periods of interference or non-interference in the audio signals. For example, in some embodiments, if $ID_{dsn}$ indicates that desired audio signals are present, e.g., $ID_{dsn}=0$, a first set of filter coefficients $hd_j^k$ are selected for use in the FNLMS filters. Otherwise, if $ID_{dsn}$ indicates that interfering audio signals are present, e.g., $ID_{dsn}=1$, a second set of filter coefficients $hi_j^k$ are selected for use in the FNLMS filters. By using the different filter coefficients for the FNLMS filters as described, these embodiments ensure the stability and robustness of filter coefficients in the event of any missed detections of interfering audio regions by interference detector 204.

In some embodiments, target/desired filter 208 uses a frame size of 10 ms and an FNLMS filter length of 256 coefficients for the filtering process. Within the FNLMS filters, dominant microphone data $ip_m^k$ is filtered from/cancelled in a $j^{th}$ input channel data to obtain the $j^{th}$ channel output. The $k^{th}$ frame of dominant microphone data $ip_m^k$ of length 10 ms is buffered with past 6 ms of dominant microphone data to generate a frame $ipi_m^k$ of 16 ms. The frame $ipi_m^k$ is converted to frequency domain via FFT:

$$ipi_m^k=[ip_m^{k-1}(6\ ms);ip_m^k];$$

$$IPI_m^k=\text{FFT}(ipi_m^k);$$

The desired audio components in the $IPI_m^k$ frame are estimated to generate an estimate $EST_m^k$ by filtering input $IPI_m^k$ with FNLMS filter impulse response using coefficients $hi_j^k$ or $hd_j^k$:

$$EST_m^k = \begin{cases} IPI_m^k * hd_j^k; & \text{if } ID_{dsn} == 0 \\ IPI_m^k * hi_j^k; & \text{if } ID_{dsn} == 1 \end{cases}$$

The estimate $EST_m^k$ is then converted into a time domain representation $est_j^k$ using an inverse FFT (IFFT) and the last 10 ms ($k^{th}$ frame data) of estimate $est_j^k$ are subtracted from $j^{th}$ input channel data $ip_j^k$ to obtain the $j^{th}$ channel output $op_j^k$:

$$est_j^k=\text{IFFT}(EST_m^k);$$

$$op_j^k=ip_j^k-est_j^k(6\ ms:16\ ms);$$

The FNLMS filtering operations are performed for all channels other than the channel of the dominant microphone to generate the above-described interference-only audio signal for each channel (the interference-only audio signal for the $j^{th}$ channel is shown above as $op_j^k$). The channel outputs $op_j^k$ for all N−1 channels other than the dominant microphone channel m are then summed to generate the output of target/desired filter $tbop^k$—which is the above-described interfering audio signal:

$$tbop^k=\Sigma op_j^k\{(\forall j\neq m)\&(\forall j<N)\}$$

In some embodiments, the FNLMS filter coefficients, i.e., $hi_j^k$ or $hd_j^k$, are updated with an adaptation factor ($\mu_{tb}$):

$$\mu_{tb} = \begin{cases} 0.4; & \text{if } ID_{dsn} == 0 \\ 0.0001; & \text{if } ID_{dsn} == 1 \end{cases}$$

In these embodiments, different approaches may be taken for updating the FNLMS filter coefficients. For example, in some embodiments, an unconstrained approach is taken, which can result in faster filter convergence but an unstable filter. As another example, in some embodiments, a constrained approach is taken, which can result in slower filter convergence but a more stable filter. For the constrained approach, the filter coefficients are updated using steepest decent gradient approach as follows:

$$hd_j^{k+1} = hd_j^k + \frac{\mu_{tb}*(IPI_m^k*conj(OP_j^k))}{PW_m^k} \quad \{\text{if } ID_{dsn} == 0\}$$

$$hi_j^{k+1} = hi_j^k + \frac{\mu_{tb}*(IPI_m^k*conj(OP_j^k))}{PW_m^k}; \quad \{\text{if } ID_{dsn} == 1\}$$

where $OP_j^k$ is the frequency domain representation of $j^{th}$ channel output $op_j^k$ and is calculated by taking FFT of the buffer with zero padding of 6 ms followed by $op_j^k$ as follows:

$$OP_j^k=[\text{zeros}(6\ ms);op_j^k]$$

In the expressions above, $PW_m^k$ is the moving average of specified bins in the power of $ip_m^k$ data:

$$PW_m^k=(\alpha*PW_m^{k-1})+(1-\alpha)*(IPI_m^k*IPI_m^k);\{\alpha=0.5\}$$

From target/desired filter 208, the output interfering audio signal is forwarded to interference filter 210. Interference filter 210 selectively filters, from the combined audio signal output by beamformer 206, the interfering audio signal, the filtering resulting in beamformed audio output 212 (step 314). Beamformed audio output 212 includes the desired audio, as summed from each of the synchronized input audio signals, with reduced or eliminated effects of interfering audio signals.

Figure 5:
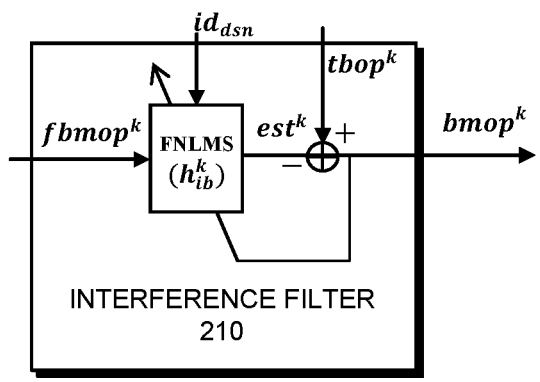
FIG. 5 presents a block diagram illustrating a filter in an interference filter functional block in accordance with some embodiments.

In some embodiments, interference filter 210 uses an adaptive filter based technique based on an FNLMS filter. FIG. 5 presents a block diagram illustrating an FNLMS filter in interference filter 210 in accordance with some embodiments. Although particular elements are shown in interference filter 210 in FIG. 5, in some embodiments, different elements are used. Generally, interference filter 210, given the indication $ID_{dsn}$ of interfering audio from interference detector 204, the combined audio signal $fbmop^k$ from beamformer 206, and the interfering audio signal $tbop^k$ from interference filter 210, generates the beamformed audio output signal $bmop^k$. In other words, interference filter 210 filters the combined audio signal $fbmop^k$ to output a single channel audio signal $bmop^k$ that includes the desired audio signal and is substantially free of interference components from the interfering audio signal $tbop^k$.

In some embodiments, the FNLMS filter in interference filter 210 is configured to use different filter coefficients for different adaptation regions—i.e., periods of interference or non-interference in the audio signals. For example, in some embodiments, if $ID_{dsn}$ indicates that desired audio signals are present, e.g., $ID_{dsn}=0$, a first set of filter coefficients $hd_{tb}^k$ are selected for use in the FNLMS filter. Otherwise, if $ID_{dsn}$ indicates that interfering audio signals are present, e.g., $ID_{dsn}=1$, a second set of filter coefficients $hi_{tb}^k$ are selected for use in the FNLMS filter. Using an FNLMS filter as described can result in stable and adaptable operation in interference filter 210.

In some embodiments, interference filter 210 uses a frame size of 10 ms and an FNLMS filter length of 256 coefficients for the filtering process. Within the FNLMS filter, the interfering audio signal $tbop^k$ output by target/desired filter 208 is filtered to provide an estimate of interference components. The $k^{th}$ frame of target filter output $tbop^k$ of length 10 ms is buffered with past 6 ms data to generate a frame $ipi^k$ of 16 ms. This frame is converted to frequency domain via FFT:

$$ipi^k=[tbop^{k-1}(6\ ms);tbop^k];$$

$$IPI^k=FFT(ipi^k);$$

Interfering audio signal components in interference filter 210's output are estimated, $EST^k$ by filtering input $IPI^k$ with FNLMS filter impulse response using coefficients $hi_{ib}^k$ or $hd_{ib}^k$:

$$EST^k = \begin{cases} IPI^k * hi_{ib}^k; & \{ID_{dsn}=1\} \\ IPI^k * hd_{ib}^k; & \{ID_{dsn}=0\} \end{cases}$$

The estimate $EST^k$ is then converted into time domain representation $est^k$ using an IFFT and the last 10 ms ($k^{th}$ frame data) of estimate $est^k$ are subtracted from the combined audio signal $fbmop^k$ to obtain the beamformed audio output $bmop^k$:

$$est^k=IFFT(EST^k);$$

$$bmop^k=fbmop^k-est^k(6\ ms:16\ ms);$$

In some embodiments, FNLMS filter coefficients, $hi_{ib}^k$ or $hd_{ib}^k$, are updated with an adaptation factor ($\mu_{ib}$):

$$\mu_{ib} = \begin{cases} 0.2; & \{ID_{dsn}=1\} \\ 0.0001; & \{ID_{dsn}=0\} \end{cases}$$

In these embodiments, different approaches may be taken for updating the FNLMS filter coefficients. For example, in some embodiments, an unconstrained approach is taken, which can result in faster filter convergence but an unstable filter. As another example, in some embodiments, a constrained approach is taken, which can result in slower filter convergence but a more stable filter. For the constrained approach, the filter coefficients are updated using steepest decent gradient approach as follows:

$$hi_{ib}^{k+1} = hi_{ib}^k + \frac{\mu_{ib}*(IPI^k*conj(BMOP^k))}{PW_{tb}^k}; \quad \{if\ ID_{dsn}==1\}$$

$$hi_{ib}^{k+1} = hi_{ib}^k + \frac{\mu_{ib}*(IPI^k*conj(BMOP^k))}{PW_{tb}^k}; \quad \{if\ ID_{dsn}==0\}$$

where $BMOP^k$ is the frequency domain representation of interference filter output $bmop^k$ and is calculated by taking FFT of a buffer with zero padding of 6 ms followed by $bmop^k$ as follows:

$$BMOP^k=[zeros(6\ ms);bmop^k]$$

In the expressions above, $PW_{tb}^k$ is the moving average of specified bins in the power of $tbop^k$ data.

$$PW_{tb}^k=(\alpha*PW_{tb}^{k-1})+(1-\alpha)*(IPI^k*IPI^k);\{\alpha=0.5\}$$

In some embodiments, a computing device (e.g., electronic device 100, and/or some portion thereof) uses code and/or data stored on a non-transitory computer-readable storage medium to perform some or all of the operations herein described. More specifically, the computing device reads the code and/or data from the computer-readable storage medium and executes the code and/or uses the data when performing the described operations. A computer-readable storage medium can be any device, medium, or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs).

In some embodiments, one or more hardware modules are configured to perform the operations herein described. For example, the hardware modules can include, but are not limited to, one or more processors/cores/central processing units (CPUs), application-specific integrated circuit (ASIC) chips, field-programmable gate arrays (FPGAs), compute units, embedded processors, graphics processors (GPUs)/graphics cores, pipelines, Accelerated Processing Units (APUs), system management units, power controllers, and/or other programmable-logic devices. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., electronic device 100, dominant microphone detector 202, interference detector 204, target/desired filter 208, and/or some portion thereof) is stored on a non-transitory computer-readable storage medium that includes a database or other data structure which can be read by a computing device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device, comprising:
a plurality of microphones, each pair of microphones in the plurality of microphones being a respective distance from one another; and
a beamformer functional block that receives audio signals from each of the microphones, the beamformer functional block configured to:
detect a dominant microphone based on the audio signals from each of the microphones and the distances between the microphones, the dominant microphone being in a closest direction, among the plurality of microphones, to a source of desired audio;
detect interfering audio signals based on phase coherence between audio signals from the dominant microphone and audio signals from other microphones in the plurality of microphones; and
generate a beamformed audio output signal based on the audio signals and the interfering audio signals from each of the microphones.

2. The electronic device of claim 1, wherein detecting the dominant microphone comprises:
for each microphone:
selecting that microphone as a reference microphone;
generating a synchronized audio signal by summing the audio signal from the reference microphone with a synchronized audio signal from each other microphone, wherein the synchronized audio signal from each other microphone is the audio signal for that other microphone aligned in time with the audio signal from the reference microphone, the alignment in time being based at least in part on a distance between the reference microphone and that other microphone; and
estimating an entropy for the reference microphone based on the synchronized audio signal; and
detecting, as the dominant microphone, a microphone with a highest entropy.

3. The electronic device of claim 2, wherein the generating and estimating are performed at two or more times in a period of time and the microphone with the highest entropy during the period of time is detected as the dominant microphone.

4. The electronic device of claim 1, wherein detecting the interfering audio signals comprises:
until each microphone other than the dominant microphone is checked:
choosing one or more unchecked microphones;
selecting a subset of samples of the audio signal from the one or more unchecked microphones and a corresponding subset of samples from the audio signal of the dominant microphone;
converting, to a frequency domain representation, each of the subset of the samples of the audio signal from the one or more unchecked microphones and the subset of the samples from the audio signal of the dominant microphone;
computing a sum of an estimated phase coherence of the frequency-domain representations in a specified frequency range; and
detecting no interfering audio signals based on the sum being zero or positive, but detecting interfering audio signals based on the sum being negative and less than a computed threshold.

5. The electronic device of claim 4, wherein detecting the interfering audio signals further comprises:
updating a hysteresis counter based on the sum, the updating comprising setting the hysteresis counter to a specified value when the sum is negative and less than a computed threshold and decrementing the hysteresis counter when the sum is zero or positive; and
performing the detecting based on a value of the hysteresis counter.

6. The electronic device of claim 1, wherein the beamformer functional block is further configured to:
generate a combined audio signal by summing the audio signal from the dominant microphone with a synchronized audio signal from each other microphone, wherein the synchronized audio signal from each other microphone is the audio signal for that other microphone aligned in time with the audio signal from the dominant microphone.

7. The electronic device of claim 6, wherein the beamformer functional block is further configured to:
filter, from the audio signal from each other microphone, the audio signal from the dominant microphone to generate an interference-only audio signal for that microphone; and
generate an interfering audio signal by summing the interference-only audio signal for each other microphone.

8. The electronic device of claim 7, wherein filtering the audio signal from the dominant microphone from the audio signal from each other microphone comprises:
using first frequency normalized least mean squares (FNLMS) filters to perform the filtering, the first FNLMS filters having two sets of estimated coefficients that are selectively used based on detecting the interfering audio signals.

9. The electronic device of claim 7, wherein generating the beamformed audio output signal comprises:
filter, from the combined audio signal, the interfering audio signal, the filtering resulting in the beamformed audio output signal.

10. The electronic device of claim 9, wherein filtering the interfering audio signal from the combined audio signal comprises:
using a second FNLMS filter to perform the filtering, the second FNLMS filter having two sets of estimated coefficients that are selectively used based on detecting the interfering audio signals.

11. The electronic device of claim 6, wherein the beamformer functional block is further configured to:
determine an amount of time for the alignment in time of the audio signal for each other microphone with the audio signal from the dominant microphone based on:
a peak location of a cross correlation between audio signals for the dominant microphone and that other microphone; and a peak of an estimated impulse response between audio signals for the dominant microphone and that other microphone.

12. The electronic device of claim 1, wherein the beamformer functional block is further configured to:
preprocess the audio signals from each of the microphones, the preprocessing comprising one or more of:
eliminating low frequency components from the audio signals; and
adjusting levels of each of the audio signals based on a specified reference input level.

13. A method for generating a beamformed audio output signal in an electronic device that comprises a plurality of microphones, each pair of microphones in the plurality of microphones being a respective distance from one another, the method comprising:
in a beamformer functional block in the electronic device:
receiving audio signals from each of the microphones;
detecting a dominant microphone based on the audio signals from each of the microphones and the distances between the microphones, the dominant microphone being in a closest direction, among the plurality of microphones, to a source of desired audio;
detecting interfering audio signals based on phase coherence between audio signals from the dominant microphone and audio signals from other microphones in the plurality of microphones; and
generating a beamformed audio output signal based on the audio signals and the interfering audio signals from each of the microphones.

14. The method of claim 13, wherein detecting the dominant microphone comprises,
for each microphone:
selecting that microphone as a reference microphone;
generating a synchronized audio signal by summing the audio signal from the reference microphone with a synchronized audio signal from each other microphone, wherein the synchronized audio signal from each other microphone is the audio signal for that other microphone aligned in time with the audio signal from the reference microphone, the alignment in time being based at least in part on a distance between the reference microphone and that other microphone; and
estimating an entropy for the reference microphone based on the synchronized audio signal; and
detecting, as the dominant microphone, a microphone with a highest entropy.

15. The method of claim 14, wherein the generating and estimating are performed at two or more times in a period of time and the microphone with the highest entropy during the period of time is detected as the dominant microphone.

16. The method of claim 13, wherein detecting the interfering audio signals comprises:
until each microphone other than the dominant microphone is checked:
choosing one or more unchecked microphones;
selecting a subset of samples of the audio signal from the one or more unchecked microphones and a corresponding subset of samples from the audio signal of the dominant microphone;
converting, to a frequency domain representation, each of the subset of the samples of the audio signal from the one or more unchecked microphones and the subset of the samples from the audio signal of the dominant microphone;
computing a sum of an estimated phase coherence of the frequency-domain representations in a specified frequency range; and
detecting no interfering audio signals based on the sum being zero or positive, but detecting interfering audio signals based on the sum being negative and less than a computed threshold.

17. The method of claim 16, wherein detecting the interfering audio signals further comprises:
updating a hysteresis counter based on the sum, the updating comprising setting the hysteresis counter to a specified value when the sum is negative and less than a computed threshold and decrementing the hysteresis counter when the sum is zero or positive; and
performing the detecting based on a value of the hysteresis counter.

18. The method of claim 13, further comprising:
generating, by the beamformer functional block, a combined audio signal by summing the audio signal from the dominant microphone with a synchronized audio signal from each other microphone, wherein the synchronized audio signal from each other microphone is the audio signal for that other microphone aligned in time with the audio signal from the dominant microphone.

19. The method of claim 18, further comprising:
using, by the beamformer functional block, first frequency normalized least mean squares (FNLMS) filters to filter, from the audio signal from each other microphone, the audio signal from the dominant microphone to generate an interference-only audio signal for that microphone, wherein the first FNLMS filters have two sets of estimated coefficients that are selectively used based on detecting the interfering audio signals; and
generating an interfering audio signal by summing the interference-only audio signal for each other microphone.

20. The method of claim 19, further comprising:
using, by the beamformer functional block, a second FNLMS filter to filter, from the combined audio signal, the interfering audio signal, the filtering resulting in the beamformed audio output signal, wherein the second FNLMS filter has two sets of estimated coefficients that are selectively used based on detecting the interfering audio signals.

* * * * *